US010284331B2

(12) United States Patent
Yan et al.

(10) Patent No.: US 10,284,331 B2
(45) Date of Patent: May 7, 2019

(54) CHANNEL DECODING METHOD, APPARATUS, AND SYSTEM

(71) Applicant: HUAWEI TECHNOLOGIES CO., LTD., Shenzhen, Guangdong (CN)

(72) Inventors: Kai Yan, Shanghai (CN); Juhua Xue, Shanghai (CN); Ming Li, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 15/833,560

(22) Filed: Dec. 6, 2017

(65) Prior Publication Data
US 2018/0123730 A1 May 3, 2018

Related U.S. Application Data

(63) Continuation of application No. PCT/CN2015/081352, filed on Jun. 12, 2015.

(51) Int. Cl.
*H04L 1/00* (2006.01)
*H03M 13/29* (2006.01)
(Continued)

(52) U.S. Cl.
CPC .......... *H04L 1/0009* (2013.01); *H03M 13/29* (2013.01); *H03M 13/3746* (2013.01);
(Continued)

(58) Field of Classification Search
CPC ... H04L 1/0001; H04L 1/0009; H04L 1/0054; H04L 1/1812; H04M 13/29;
(Continued)

(56) References Cited

U.S. PATENT DOCUMENTS

| 6,105,158 A * | 8/2000 | Chen ..................... H03M 13/09 714/755 |
| 6,608,828 B1 | 8/2003 | Balachandran |
| 2004/0002309 A1* | 1/2004 | Ashikhmin ............. H04L 1/005 455/135 |
| 2004/0013105 A1 | 1/2004 | Ahmavaara et al. |

(Continued)

FOREIGN PATENT DOCUMENTS

| CN | 1399828 A | 2/2003 |
| CN | 1490972 A | 4/2004 |
| CN | 101795184 A | 8/2010 |

(Continued)

OTHER PUBLICATIONS

International Search Report in International Application No. PCT/CN2015/081352, dated Feb. 29, 2016, 6 pages.

*Primary Examiner* — Afsar M Qureshi
(74) *Attorney, Agent, or Firm* — Fish & Richardson P.C.

(57) ABSTRACT

Embodiments of the present invention disclose a channel decoding method, apparatus, and system. The channel decoding apparatus includes a memory storing instructions; and a processor coupled to the memory to execute the instructions to: obtain decoding information of first channel decoding of a data block; determine whether the first channel decoding fails; in response to determining that the first channel decoding fails, obtain a reference sequence number of the data block; obtain at least one matching historical demodulated soft value; combine the demodulated soft value of the data block and the at least one matching historical demodulated soft value to obtain a combined demodulated soft value of the data block; and perform second channel decoding on the combined demodulated soft value of the data block.

18 Claims, 3 Drawing Sheets

(51) Int. Cl.
*H03M 13/37* (2006.01)
*H03M 13/00* (2006.01)
H03M 13/09 (2006.01)
H03M 13/41 (2006.01)

(52) U.S. Cl.
CPC ... *H03M 13/3769* (2013.01); *H03M 13/6306* (2013.01); *H04L 1/0054* (2013.01); *H03M 13/09* (2013.01); *H03M 13/4115* (2013.01)

(58) Field of Classification Search
CPC ......... H04M 13/2903; H04M 13/3746; H04M 13/3769; H04M 13/6306; H04M 13/09; H04M 13/4115
See application file for complete search history.

(56) References Cited

U.S. PATENT DOCUMENTS

| | | | | |
|---|---|---|---|---|
| 2009/0172503 | A1* | 7/2009 | Takanashi | H03M 13/3753 714/792 |
| 2010/0246491 | A1* | 9/2010 | Bae | H04L 1/1845 370/328 |
| 2011/0060971 | A1* | 3/2011 | Zeng | H03M 13/413 714/786 |
| 2014/0089770 | A1* | 3/2014 | Wei | H04L 1/0061 714/807 |

FOREIGN PATENT DOCUMENTS

| | | | | |
|---|---|---|---|---|
| CN | 101894075 | * | 11/2010 | ............ H01L 1/18 |
| CN | 101894075 A | | 11/2010 | |
| CN | 102223216 A | | 10/2011 | |

\* cited by examiner

CHANNEL DECODING METHOD, APPARATUS, AND SYSTEM

CROSS-REFERENCE TO RELATED APPLICATIONS

This application is a continuation of International Application No. PCT/CN2015/081352, filed on Jun. 12, 2015, the disclosure of which is hereby incorporated by reference in its entirety.

TECHNICAL FIELD

Embodiments of the present invention relate to the communications field, and in particular, to a channel decoding method, apparatus, and system.

BACKGROUND

The universal mobile telecommunications system (UMTS) is a third generation (3G) mobile telephone technology that is most widely used at present. In the UMTS, after completing decoding of data, a physical layer of a receive end passes a check result and decoded data on to a radio link control (RLC) layer of the receive end through a medium access control (MAC) layer. For an RLC entity in acknowledged mode (AM), if decoding at the physical layer fails, an RLC entity of a transmit end is required to retransmit the data to improve a decoding success rate.

Due to a long time and low efficiency of retransmission at the RLC layer, a high speed packet access (HSPA) technology is further introduced to the UMTS, and a hybrid automatic repeat request (HARQ) is supported at the MAC layer, so that data retransmission efficiency is significantly improved, a retransmission rate at the RLC layer is accordingly reduced, and performance of the UMTS is improved.

However, in the UMTS system, a service that does not support a MAC-layer HARQ and uses an RLC AM entity, such as signaling and a packet-switched (PS) R99 service cannot obtain performance gains brought by an HSPA. Because the service cannot support the HARQ at the MAC layer, correspondingly, a retransmission rate at the RLC layer is higher than a retransmission rate of a service that supports the HARQ at the MAC layer. In addition, because a retransmission time at the RLC layer is relatively long, quality of service (QoS) of a service that does not support the HARQ at the MAC layer is affected.

SUMMARY

In view of this, embodiments of the present invention provide a channel decoding method, apparatus and system, to increase a decoding success rate and improve quality of service for a service that does not support a MAC-layer HARQ.

According to a first aspect, an embodiment of the present invention provides a channel decoding apparatus, where the apparatus includes:

a decoding information obtaining unit, configured to obtain decoding information of first channel decoding of a data block, where the decoding information of the first channel decoding includes a decoding result of the first channel decoding of the data block and a demodulated soft value of the data block;

a sequence number obtaining unit, configured to: if a check on the decoding result of the first channel decoding of the data block obtained by the decoding information obtaining unit fails, obtain a reference sequence number of the data block according to the decoding result of the first channel decoding of the data block;

a historical soft value obtaining unit, configured to obtain at least one matching historical demodulated soft value from a historical demodulated soft value record table according to the reference sequence number of the data block obtained by the sequence number obtaining unit, where the historical demodulated soft value record table includes at least one historical demodulated soft value record, and each historical demodulated soft value record includes a historical demodulated soft value and a reference sequence number of a data block corresponding to the historical demodulated soft value;

a soft value combination unit, configured to combine the demodulated soft value of the data block and the at least one matching historical demodulated soft value obtained by the historical soft value obtaining unit to obtain a combined demodulated soft value of the data block; and a second channel decoding unit, configured to perform second channel decoding on the combined demodulated soft value of the data block obtained by the soft value combination unit.

In a first possible implementation of the first aspect, the first channel decoding includes:

physical-layer Viterbi algorithm VA decoding or high-order decoding; or radio link control RLC-layer VA decoding or high-order decoding, where the high-order decoding includes parallel list VA decoding or serial list VA decoding.

With reference to the first aspect, or the first possible implementation of the first aspect, in a second possible implementation, the historical soft value obtaining unit is specifically configured to:

determine at least one first historical demodulated soft value record in the historical demodulated soft value record table according to the reference sequence number of the data block, where the $0^{th}$ bit to the $M^{th}$ bit in binary of a reference sequence number of the at least one first historical demodulated soft value record are the same as the $0^{th}$ bit to the $M^{th}$ bit in binary of the reference sequence number of the data block, where M is a positive integer greater than 0 and less than or equal to N, and N is a binary length of the reference sequence number of the data block; and obtain, from the at least one first historical demodulated soft value record, a demodulated soft value of the record as the at least one matching historical demodulated soft value.

With reference to any one of the first aspect, or the first to the second possible implementations of the first aspect, in a third possible implementation, the soft value combination unit is specifically configured to:

add up the demodulated soft value of the data block and the at least one matching historical demodulated soft value to obtain the combined demodulated soft value of the data block; or combine the demodulated soft value of the data block and the at least one matching historical demodulated soft value according to a quality threshold, to obtain the combined demodulated soft value of the data block.

With reference to any one of the first aspect, or the first to the third possible implementations of the first aspect, in a fourth possible implementation, the second channel decoding includes:

physical-layer Viterbi algorithm VA decoding or high-order decoding; or radio link control RLC-layer VA decoding or high-order decoding, where the high-order decoding includes parallel list VA decoding or serial list VA decoding.

With reference to any one of the first aspect, or the first to the third possible implementations of the first aspect, in a fifth possible implementation, the apparatus further includes:

a soft value adding unit, configured to: if the decoding by the second channel decoding unit fails, add a second historical demodulated soft value record to the historical demodulated soft value record table, where a reference sequence number of the second historical demodulated soft value record is the reference sequence number of the data block, and a demodulated soft value of the second historical demodulated soft value record is a demodulated soft value of the data block.

With reference to any one of the first aspect, or the first to the fifth possible implementations of the first aspect, in a sixth possible implementation, the apparatus further includes:

a soft value deletion unit, configured to: if the decoding by the second channel decoding unit succeeds, delete the at least one first historical demodulated soft value record from the historical demodulated soft value record table.

With reference to any one of the first aspect, or the first to the sixth possible implementations of the first aspect, in a seventh possible implementation, a service type of the data block is signaling or an R99 packet service.

With reference to any one of the first aspect, or the first to the seventh possible implementations of the first aspect, in an eighth possible implementation, the channel decoding apparatus is deployed on a base station, a controller, or a mobile terminal.

According to a second aspect, an embodiment of the present invention provides a channel decoding method, where the method includes:

obtaining decoding information of first channel decoding of a data block, where the decoding information of the first channel decoding includes a decoding result of the first channel decoding of the data block and a demodulated soft value of the data block;

if a check on the decoding result of the first channel decoding of the data block fails, obtaining a reference sequence number of the data block according to the decoding result of the first channel decoding of the data block;

obtaining at least one matching historical demodulated soft value from a historical demodulated soft value record table according to the reference sequence number of the data block, where the historical demodulated soft value record table includes at least one historical demodulated soft value record, and each historical demodulated soft value record includes a historical demodulated soft value and a reference sequence number of a data block corresponding to the historical demodulated soft value;

combining the demodulated soft value of the data block and the at least one matching historical demodulated soft value to obtain a combined demodulated soft value of the data block; and performing second channel decoding on the combined demodulated soft value of the data block.

In a first possible implementation of the second aspect, the first channel decoding includes:

physical-layer Viterbi algorithm VA decoding or high-order decoding; or radio link control RLC-layer VA decoding or high-order decoding, where the high-order decoding includes parallel list VA decoding or serial list VA decoding.

With reference to the second aspect, or the first possible implementation of the second aspect, in a second possible implementation, the obtaining at least one matching historical demodulated soft value from a historical demodulated soft value record table according to the reference sequence number of the data block includes:

determining at least one first historical demodulated soft value record in the historical demodulated soft value record table according to the reference sequence number of the data block, where the $0^{th}$ bit to the $M^{th}$ bit in binary of a reference sequence number of the at least one first historical demodulated soft value record are the same as the $0^{th}$ bit to the $M^{th}$ bit in binary of the reference sequence number of the data block, where M is a positive integer greater than 0 and less than or equal to N, and N is a binary length of the reference sequence number of the data block; and obtaining, from the at least one first historical demodulated soft value record, a demodulated soft value of the record as the at least one matching historical demodulated soft value.

With reference to any one of the second aspect, or the first to the second possible implementations of the second aspect, in a third possible implementation, the combining the demodulated soft value of the data block and the at least one matching historical demodulated soft value to obtain a combined demodulated soft value of the data block includes:

adding up the demodulated soft value of the data block and the at least one matching historical demodulated soft value to obtain the combined demodulated soft value of the data block; or combining the demodulated soft value of the data block and the at least one matching historical demodulated soft value according to a quality threshold, to obtain the combined demodulated soft value of the data block.

With reference to any one of the second aspect, or the first to the third possible implementations of the second aspect, in a fourth possible implementation, the second channel decoding includes:

physical-layer Viterbi algorithm VA decoding or high-order decoding; or radio link control RLC-layer VA decoding or high-order decoding, where the high-order decoding includes parallel list VA decoding or serial list VA decoding.

With reference to any one of the second aspect, or the first to the fourth possible implementations of the second aspect, in a fifth possible implementation, the method further includes:

if the second channel decoding fails, adding a second historical demodulated soft value record to the historical demodulated soft value record table, where a reference sequence number of the second historical demodulated soft value record is the reference sequence number of the data block, and a demodulated soft value of the second historical demodulated soft value record is a demodulated soft value of the data block.

With reference to any one of the second aspect, or the first to the fifth possible implementations of the second aspect, in a sixth possible implementation, the method further includes:

if the second channel decoding succeeds, deleting the at least one first historical demodulated soft value record from the historical demodulated soft value record table.

With reference to any one of the second aspect, or the first to the sixth possible implementations of the second aspect, in a seventh possible implementation, a service type of the data block is signaling or an R99 packet service.

According to a third aspect, an embodiment of the present invention provides a channel decoding system, where the system includes:

a demodulator, configured to demodulate a received data block to obtain a demodulated soft value of the data block;

a first channel decoding apparatus, configured to decode the demodulated soft value of the data block obtained by the demodulator; and a second channel decoding apparatus according to any possible implementation of the first aspect.

By means of the method, the apparatus, and the system in the embodiments of the present invention, for a service that does not support a MAC-layer HARQ and is in RLC AM, when transmission of a data block occurs, if decoding fails, decoding is performed one more time after demodulated soft values, received one or more times, of the data block are combined. This can increase a decoding success rate, thereby reducing a quantity of retransmissions of the data block and improving quality of service.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

A method, an apparatus, and a system in the embodiments of the present invention may be implemented by using a radio access network device, or may be implemented by using a mobile terminal. Implementation of the radio access network device includes, but is not limited to, one of or a combination of more than one of the following: for example, a base station NodeB, a radio network controller RNC, or a control node of another access network device.

Figure 1:
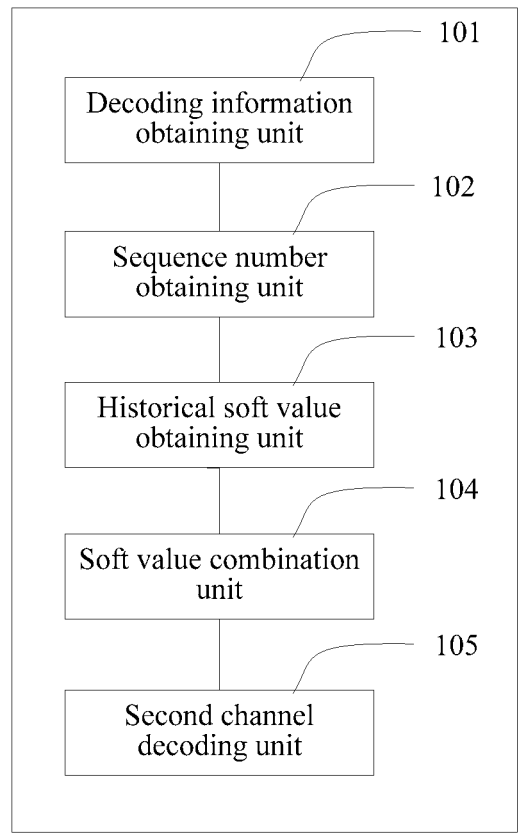
FIG. 1 is a structural diagram of a channel decoding apparatus according to an embodiment of the present invention.

FIG. 1 is a structural diagram of a channel decoding apparatus according to an embodiment of the present invention. The channel decoding apparatus may be deployed on a radio access network device, such as a base station or a controller, to process received uplink data sent by a mobile terminal, or may be deployed on a mobile terminal, to process received downlink data sent by a radio access network device. As shown in the figure, the apparatus may include a decoding information obtaining unit 101, a sequence number obtaining unit 102, a historical soft value obtaining unit 103, a soft value combination unit 104, and a second channel decoding unit 105.

The decoding information obtaining unit 101 is configured to obtain decoding information of first channel decoding of a data block, where the decoding information of the first channel decoding of the data block includes a decoding result of the first channel decoding of the data block and a demodulated soft value of the data block. Herein, a service type of the data block may be signaling or an R99 packet service, that is, a service that does not support a MAC-layer HARQ and uses an RLC AM entity.

The decoding information obtaining unit 101 may obtain information about first decoding of the data block from a physical layer of a receive end, or may obtain information about second decoding of the data block from an RLC layer of a receive end.

In an embodiment of the present invention, during the first decoding performed on the data block, the physical layer of the receive end may decode the data block by using conventional Viterbi algorithm (VA) decoding, or by deploying a high-order decoder, such as parallel list VA (PLVA) or serial list VA (SLVA). Therefore, the first channel decoding of the data block may be physical-layer VA decoding, or may be decoding by a physical-layer high-order decoder.

In another embodiment of the present invention, after the first decoding performed by the physical layer of the receive end on the data block fails, second decoding may be performed on the data block by deploying VA or a high-order decoder, such as PLVA or SLVA, at the RLC layer. In this case, the decoding information obtaining unit 101 obtains the decoding information of the data block from the RLC layer, where the first channel decoding of the data block may be RLC-layer VA decoding, or may be decoding by an RLC-layer high-order decoder.

The sequence number obtaining unit 102 is configured to: if a check on the decoding result of the first channel decoding of the data block obtained by the decoding information obtaining unit 101 fails, obtain a reference sequence number of the data block according to the decoding result of the first channel decoding of the data block.

If a CRC check on the decoding result of the first channel decoding of the data block obtained by the decoding information obtaining unit 101 fails, the reference sequence number of the data block may be extracted from the decoding result. The reference sequence number may be obtained from a specified bit position of the decoding result. If the check on the decoding result succeeds, an RLC protocol data unit (PDU) sequence number of the data block is obtained from the specified bit position of the decoding result. However, if the check on the decoding result fails, a reference sequence number obtained from the specified bit position of the decoding result and used as the reference sequence number of the data block has a particular probability of an error compared with an actual sequence number of the data block. For example, if the decoding result is correct, an obtained RLC PDU sequence number of the data block is 010010001001. However, if the check on the decoding result fails, an obtained RLC PDU sequence number of the data block is 001010101001. In other words, if the check on the decoding result fails, the lowest five bits of the obtained reference sequence number of the data block are the same as the lowest five bits of the RLC PDU sequence number obtained when the decoding result of the data block is correct, but higher bits have errors. It should be noted that the above is merely an example, and the present invention is not limited thereto.

The historical soft value obtaining unit 103 is configured to obtain at least one matching historical demodulated soft value from a historical demodulated soft value record table according to the reference sequence number obtained by the sequence number obtaining unit 102.

The historical demodulated soft value record table includes at least one historical demodulated soft value record, and each historical demodulated soft value record includes a reference sequence number and a demodulated soft value of a data block corresponding to the reference sequence number.

The historical demodulated soft value record table is used to: before the channel decoding apparatus performs current decoding, record a demodulated soft value of a received data block on which decoding fails, and a reference sequence number corresponding to the demodulated soft value. For a service that does not support a MAC-layer HARQ, an obtained demodulated soft value of each data block does not additionally carry an RLC PDU sequence number. Therefore, a reference sequence number extracted from a result of failed decoding may be used as a reference sequence number corresponding to a demodulated soft value of the failed decoding.

For a service that does not support a MAC-layer HARQ and uses an RLC AM entity, if decoding of a data block of the service fails, an RLC layer performs at least one retransmission until decoding succeeds or a retransmission threshold is reached. Therefore, the historical demodulated soft value record table may record demodulated soft values of decoding when the data block is transmitted multiple times and a reference sequence number of each decoding. For example, if decoding still fails after a data block is retransmitted twice, the historical demodulated soft value record table records a demodulated soft value in a first transmission of the data block and a corresponding reference sequence number that is in a decoding result in the first transmission of the data block, a demodulated soft value in a first retransmission of the data block and a corresponding reference sequence number that is in a decoding result in the first retransmission of the data block, and a demodulated soft value in a second retransmission of the data block and a corresponding reference sequence number that is in a decoding result in the second retransmission of the data block.

Reference sequence numbers obtained from results of the failed decoding may not be able to accurately reflect a sequence number of the data block. Therefore, the matching historical demodulated soft value may be obtained by performing matching on lowest bits of the reference sequence numbers. Reference sequence numbers with same lowest bits may be considered as different decoding values of a same data block after the data block is retransmitted.

In an embodiment of the present invention, the historical soft value obtaining unit 103 may determine at least one first historical demodulated soft value record in the historical demodulated soft value records according to the reference sequence number of the data block, and obtain a demodulated soft value of each first historical demodulated soft value record as a matching historical demodulated soft value.

The $0^{th}$ bit to the $M^{th}$ bit in binary of a reference sequence number of each first historical demodulated soft value record are the same as the $0^{th}$ bit to the $M^{th}$ bit in binary of the reference sequence number of the data block. In other words, a historical demodulated soft value record of which the lowest (M+1) bits of a sequence number are the same as the lowest (M+1) bits of the reference sequence number of the data block is determined as the first historical demodulated soft value record. M is a positive integer greater than 0 and less than or equal to N, N is a binary length of the reference sequence number of the data block, and usually, N is less than or equal to 12. In other words, reference sequence numbers with same lowest (M+1) bits may be considered as different decoding values of an RLC PDU sequence number of a same data block in different transmissions, and therefore, corresponding demodulated soft values may be considered as demodulated soft values of a same data block in different transmissions.

The soft value combination unit 104 is configured to combine the demodulated soft value of the data block and the at least one matching historical demodulated soft value obtained by the historical soft value obtaining unit 103 to obtain a combined demodulated soft value of the data block.

The demodulated soft value of the data block and the at least one matching historical demodulated soft value may be combined in various manners. For example, the demodulated soft value of the data block and the obtained at least one matching historical demodulated soft value are added up to obtain a combined demodulated soft value of the data block. For another example, according to a quality threshold, a historical demodulated soft value satisfying a quality threshold requirement is selected from the one or more obtained matching historical demodulated soft values, and the selected historical demodulated soft value and the demodulated soft value of the data block are added up to obtain a combined demodulated soft value of the data block. It should be noted that the above are merely examples, and the present invention is not limited thereto.

The second channel decoding unit 105 is configured to perform second channel decoding on the combined demodulated soft value of the data block obtained by the soft value combination unit 104.

The second channel decoding may be deployed at a physical layer and use VA decoding or high-order decoding, or may be deployed at an RLC layer and use VA decoding or high-order decoding. Using an uplink direction of a UMTS system as an example, when the second channel decoding is deployed at a physical layer and uses VA or high-order decoding, the channel decoding apparatus in this embodiment of the present invention may be deployed on a NodeB; when the second channel decoding is deployed at an RLC layer and uses VA or high-order decoding, the channel decoding apparatus in this embodiment of the present invention may be deployed on an RNC. Using a downlink direction of a UMTS system as an example, the channel decoding apparatus in this embodiment of the present invention may be deployed on a mobile terminal, and a second channel decoding apparatus may be deployed at a physical layer and use VA or high-order decoding, or may be deployed at an RLC layer and use VA or high-order decoding. It should be noted that described here are merely examples, and this embodiment of the present invention is not limited thereto.

In another embodiment of the present invention, if the decoding by the second channel decoding unit 105 fails, the channel decoding apparatus may further include a soft value adding unit, configured to add a second historical demodulated soft value record to the historical demodulated soft value record table. A reference sequence number of the second historical demodulated soft value record is the reference sequence number of the data block, and a demodulated soft value of the second historical demodulated soft value record is a demodulated soft value of the data block. In other words, the soft value adding unit may add the demodulated soft value and the reference sequence number of the data block as one historical demodulated soft value record to the historical demodulated soft value record table, for use in combination and decoding when the data block is retransmitted and decoded next time.

In another embodiment of the present invention, the channel decoding apparatus may further include a soft value deletion unit. If the decoding by the second channel decoding unit 105 succeeds, the soft value deletion unit may be configured to delete the first historical demodulated soft value record corresponding to the combined historical demodulated soft value. Because the decoding of the data block succeeds, the historical demodulated soft value record matching the data block may be deleted so as to save storage space. All first historical demodulated soft value records may be deleted, or first historical demodulated soft value records corresponding to historical demodulated soft values related to the combination may be deleted. The present invention is not limited thereto.

In another embodiment of the present invention, if a storage time of a third historical demodulated soft value record exceeds a time threshold T, the soft value deletion unit may be configured to delete the third historical demodulated soft value record so as to save storage space.

By means of the apparatus in this embodiment of the present invention, for a service that does not support a MAC-layer HARQ and is in RLC AM, when transmission of a data block occurs, if decoding fails, decoding is performed one more time after demodulated soft values, received one or more times, of the data block are combined. This can increase a decoding success rate, thereby reducing a quantity of retransmissions of the data block and improving quality of service.

Figure 2:
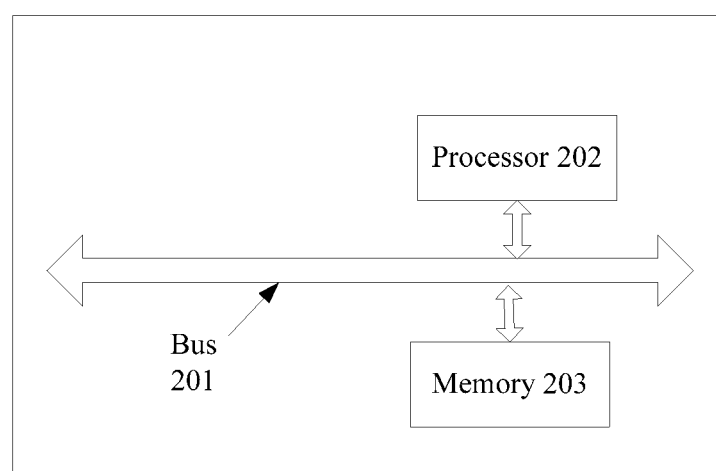
FIG. 2 is a structural diagram of a channel decoding apparatus according to another embodiment of the present invention.

FIG. 2 is a structural diagram of a channel decoding apparatus according to another embodiment of the present invention. The channel decoding apparatus may be deployed on a radio access network device, such as a base station or a controller, to process received uplink data sent by a mobile terminal, or may be deployed on a mobile terminal, to process received downlink data sent by a radio access network device. As shown in the figure, the apparatus may include a bus 201, a processor 202 connected to the bus 201, and a memory 203 connected to the bus 201. The processor 202 invokes, through the bus 201, an instruction stored in the memory 203, so as to obtain decoding information of first channel decoding of a data block, where the decoding information of the first channel decoding includes a decoding result of the first channel decoding of the data block and a demodulated soft value of the data block. If a check on the decoding result of the first channel decoding of the data block fails, the processor 202 obtains a reference sequence number of the data block according to the decoding result of the first channel decoding of the data block, and obtains at least one matching historical demodulated soft value from a historical demodulated soft value record table according to the reference sequence number of the data block, where the historical demodulated soft value record table includes at least one historical demodulated soft value record, and each historical demodulated soft value record includes a historical demodulated soft value and a reference sequence number of a data block corresponding to the historical demodulated soft value. The processor 202 combines the demodulated soft value of the data block and the at least one matching historical demodulated soft value to obtain a combined demodulated soft value of the data block, and performs second channel decoding on the combined demodulated soft value of the data block.

A service type of the data block may be signaling or an R99 packet service, that is, a service that does not support a MAC-layer HARQ and uses an RLC AM entity. The processor 202 may obtain information about first decoding of the data block from a physical layer of a receive end, or may obtain information about second decoding of the data block from an RLC layer of a receive end. In an embodiment of the present invention, during the first decoding performed on the data block, the physical layer of the receive end may decode the data block by using conventional VA decoding, or by deploying a high-order decoder, such as PLVA or SLVA. Therefore, the first channel decoding of the data block may be physical-layer VA decoding, or may be decoding by a physical-layer high-order decoder. In another embodiment of the present invention, after the first decoding performed by the physical layer of the receive end on the data block fails, second decoding may be performed by deploying VA or a high-order decoder, such as PLVA or SLVA, at the RLC layer. In this way, the processor 202 obtains the decoding information of the data block from the RLC layer. The first channel decoding of the data block may be RLC-layer VA decoding, or may be decoding by an RLC-layer high-order decoder.

The reference sequence number of the data block may be obtained from a specified bit position of the decoding result. If the check on the decoding result succeeds, an RLC PDU sequence number of the data block is obtained from the specified bit position of the decoding result. However, if the check on the decoding result fails, a reference sequence number obtained from the specified bit position of the decoding result and used as the reference sequence number of the data block has a particular probability of an error compared with an actual sequence number of the data block.

In an embodiment of the present invention, the processor 202 may determine at least one first historical demodulated soft value record in the historical demodulated soft value records according to the reference sequence number of the data block, and obtain a demodulated soft value of each first historical demodulated soft value record as a matching historical demodulated soft value. The $0^{th}$ bit to the $M^{th}$ bit in binary of a reference sequence number of each first historical demodulated soft value record are the same as the $0^{th}$ bit to the $M^{th}$ bit in binary of the reference sequence number of the data block. In other words, a historical demodulated soft value record of which the lowest (M+1) bits of a sequence number are the same as the lowest (M+1) bits of the reference sequence number of the data block is determined as the first historical demodulated soft value record. M is a positive integer greater than 0 and less than or equal to N, N is a binary length of the reference sequence number of the data block, and usually, N is less than or equal to 12. In other words, reference sequence numbers with same lowest (M+1) bits may be considered as different decoding values of an RLC PDU sequence number of a same data block in different transmissions, and therefore, corresponding demodulated soft values may be considered as demodulated soft values of a same data block in different transmissions.

The processor 202 may also combine the demodulated soft value of the data block and the at least one matching historical demodulated soft value in various manners. For example, the demodulated soft value of the data block and the obtained at least one matching historical demodulated soft value are added up to obtain a combined demodulated soft value of the data block. For another example, according to a quality threshold, a historical demodulated soft value satisfying a quality threshold requirement is selected from the one or more obtained matching historical demodulated soft values, and the selected historical demodulated soft value and the demodulated soft value of the data block are added up to obtain a combined demodulated soft value of the data block. It should be noted that the above are merely examples, and the present invention is not limited thereto.

It should be noted that the processor 202 may perform second channel decoding by using VA decoding or high-order decoding at a physical layer, or by using VA decoding or high-order decoding at an RLC layer. Using an uplink direction of a UMTS system as an example, when the processor 202 performs second channel decoding by using VA decoding or high-order decoding at a physical layer, the channel decoding apparatus in this embodiment of the present invention may be deployed on a NodeB, or when the processor 202 performs second channel decoding by using VA decoding or high-order decoding at an RLC layer, the channel decoding apparatus in this embodiment of the present invention may be deployed on an RNC. Using a downlink direction of a UMTS system as an example, the channel decoding apparatus in this embodiment of the present invention may be deployed on a mobile terminal, and the second channel decoding may use VA or high-order decoding at a physical layer, or may use VA or high-order decoding at an RLC layer. It should be noted that described here are merely examples, and this embodiment of the present invention is not limited thereto.

Optionally, if the second channel decoding fails, the processor 202 may further add a second historical demodulated soft value record to the historical demodulated soft value record table, where a reference sequence number of the second historical demodulated soft value record is the reference sequence number of the data block, and a demodulated soft value of the second historical demodulated soft value record is a demodulated soft value of the data block. In other words, the processor 202 may add the demodulated soft value and the reference sequence number of the data block as one historical demodulated soft value record to the historical demodulated soft value record table, for use in combination and decoding when the data block is retransmitted and decoded next time.

Optionally, if the second channel decoding succeeds, the processor 202 may further be configured to delete the first historical demodulated soft value record corresponding to the combined historical demodulated soft value. Because the decoding of the data block succeeds, the processor 202 may delete the historical demodulated soft value record corresponding to the historical demodulated soft value matching the data block so as to save storage space.

Optionally, if a storage time of a third historical demodulated soft value record exceeds a time threshold T, the processor 202 may be configured to delete the third historical demodulated soft value record so as to save storage space.

By means of the apparatus in this embodiment of the present invention, for a service that does not support a MAC-layer HARQ and is in RLC AM, when transmission of a data block occurs, if decoding fails, decoding is performed one more time after demodulated soft values, received one or more times, of the data block are combined. This can increase a decoding success rate, thereby reducing a quantity of retransmissions of the data block and improving quality of service.

Figure 3:
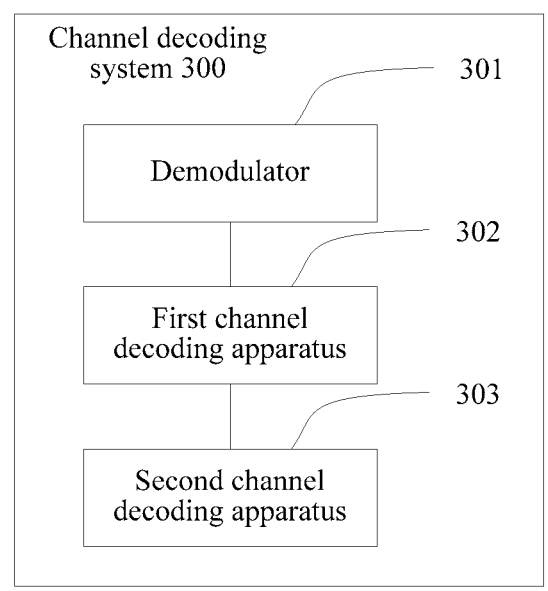
FIG. 3 is a composition diagram of a channel decoding system according to another embodiment of the present invention.

FIG. 3 is a composition diagram of a channel decoding system according to an embodiment of the present invention. As shown in the figure, the channel decoding system is configured to process a data block received by a receive end and may include a demodulator 301, a first channel decoding apparatus 302, and a second channel decoding apparatus 303.

The demodulator 301 is configured to demodulate a received data block to obtain a demodulated soft value.

The first channel decoding apparatus 302 is configured to decode the demodulated soft value of the data block obtained by the demodulator 301. The first channel decoding apparatus 302 may use VA or high-order decoding, such as PLVA decoding or SLVA decoding. In an embodiment of the present invention, the first channel decoding apparatus 302 may decode, by using VA decoding or high-order decoding at a physical layer, the demodulated soft value of the data block obtained by the demodulator 301. If the physical-layer decoding succeeds, a decoding result is reported to an RLC layer through a MAC layer, and is delivered by the RLC layer to an upper layer protocol entity for processing. Alternatively, if the physical-layer decoding fails, the first channel decoding apparatus 302 hands over a decoding result and the demodulated soft value of the data block to the second channel decoding apparatus 303 for processing.

In another embodiment of the present invention, based on the foregoing physical-layer decoding, if the physical-layer decoding fails, the first channel decoding apparatus 302 may further deploy VA decoding or high-order decoding at the RLC layer and perform second decoding on the physical-layer decoding result and demodulated soft value of the data block. If the second decoding at the RLC layer fails, the first channel decoding apparatus 302 hands over a decoding result and a demodulated soft value of the data block to the second channel decoding apparatus 303 for processing.

The second channel decoding apparatus 303 is configured to perform demodulated soft value combination and decoding when the decoding by the first channel decoding apparatus 302 fails. The second channel decoding apparatus 303 may be the channel decoding apparatus shown in FIG. 1 or FIG. 2. The channel decoding apparatus is already described in the foregoing embodiments, and details are not described herein again.

A service type of the data block may be signaling or an R99 packet service, that is, a service that does not support a MAC-layer HARQ and uses an RLC AM entity.

By means of the system in this embodiment of the present invention, for a service that does not support a MAC-layer HARQ and is in RLC AM, when transmission of a data block occurs, if decoding fails, decoding is performed one more time after demodulated soft values, received one or more times, of the data block are combined. This can increase a decoding success rate, thereby reducing a quantity of retransmissions of the data block and improving quality of service.

Figure 4:
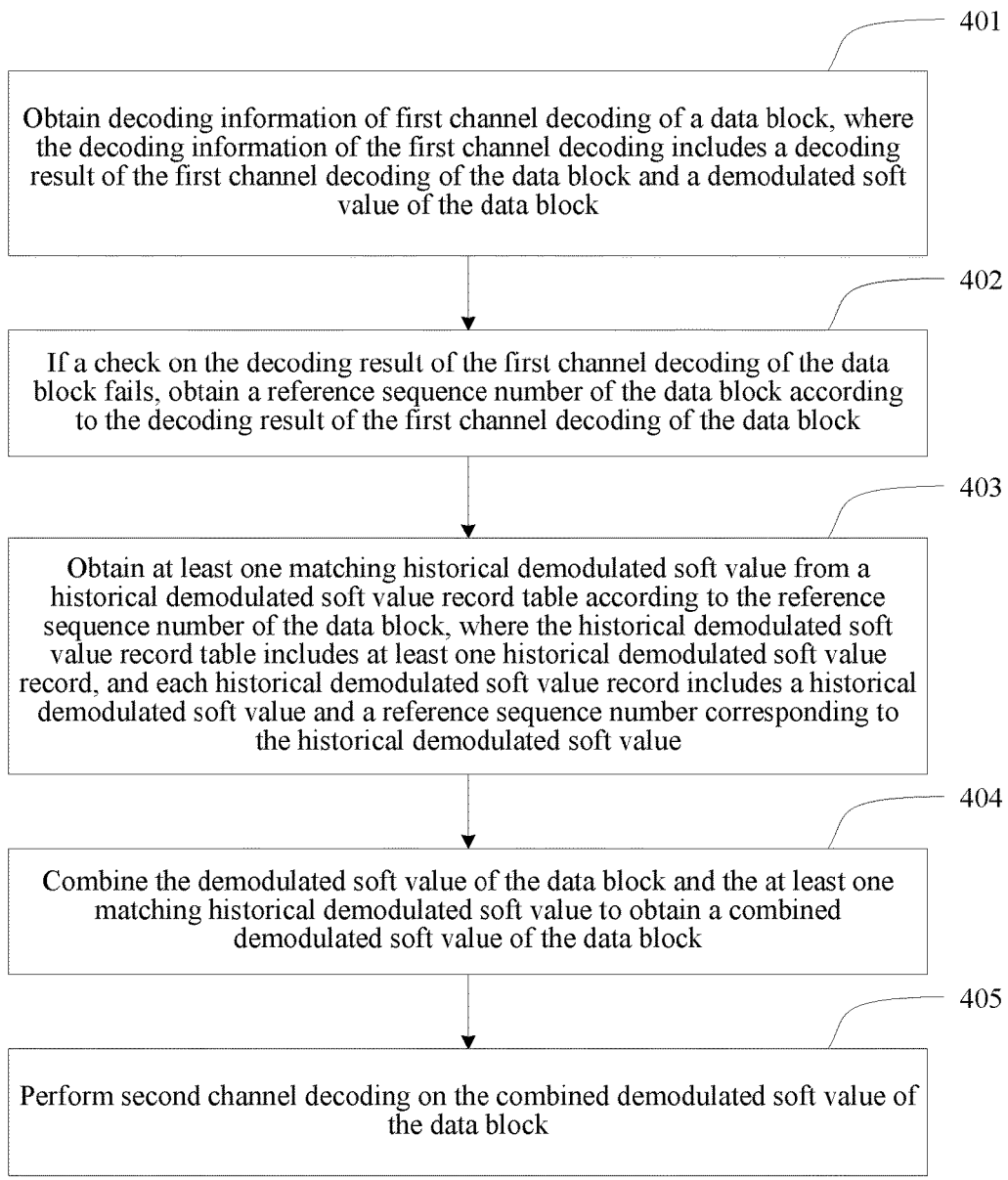
FIG. 4 is a flowchart of a channel decoding method according to another embodiment of the present invention.

FIG. 4 is a flowchart of a channel decoding method according to another embodiment of the present invention. The method may be applied to a radio access network device, such as a base station or a controller, to process received uplink data sent by a mobile terminal, or may be applied to a mobile terminal, to process received downlink data sent by a radio access network device. As shown in the figure, the method includes the following steps.

Step 401: Obtain decoding information of first channel decoding of a data block, where the decoding information of the first channel decoding of the data block includes a decoding result of the first channel decoding of the data block and a demodulated soft value of the data block. Herein, a service type of the data block may be signaling or an R99 packet service, that is, a service that does not support a MAC-layer HARQ and uses an RLC AM entity.

The decoding information of the first channel decoding of the data block may be information that is about first decoding of the data block and that is obtained from a physical layer of a receive end, or may be information that is about second decoding of the data block and that is obtained from an RLC layer of a receive end. Correspondingly, at the physical layer or the RLC layer, the data block may be decoded by using conventional VA decoding, or by using a high-order decoder such as PLVA or SLVA. Therefore, the first channel decoding of the data block may be VA decoding or decoding by a high-order decoder at the physical layer, or may be VA decoding or decoding by a high-order decoder at the RLC layer.

Step 402: If a check on the decoding result of the first channel decoding of the data block obtained in step 401 fails, obtain a reference sequence number of the data block according to the decoding result of the first channel decoding.

If a CRC check on the decoding result of the first channel decoding of the data block obtained in step 401 fails, the reference sequence number of the data block may be extracted from the decoding result. The reference sequence number may be obtained from a specified bit position of the decoding result. If the check on the decoding result succeeds, an RLC PDU sequence number of the data block is obtained from the specified bit position of the decoding result. However, if the check on the decoding result fails, a reference sequence number obtained from the specified bit position of the decoding result and used as the reference sequence number of the data block has a particular probability of an error compared with an actual sequence number of the data block. For example, if the decoding result is correct, an obtained RLC PDU sequence number of the data block is 010010001001. However, if the check on the decoding result fails, an obtained RLC PDU sequence number of the data block is 001010101001. In other words, if the check on the decoding result fails, the lowest five bits of the obtained reference sequence number of the data block are the same as the lowest five bits of the RLC PDU sequence number obtained when the decoding result of the data block is correct, but higher bits have errors. It should be noted that the above is merely an example, and the present invention is not limited thereto.

Step 403: Obtain at least one matching historical demodulated soft value from a historical demodulated soft value record table according to the reference sequence number obtained in step 402.

The historical demodulated soft value record table includes at least one historical demodulated soft value record, and each historical demodulated soft value record includes a reference sequence number and a demodulated soft value of a data block corresponding to the reference sequence number.

The historical demodulated soft value record table is used to: before the channel decoding apparatus performs current decoding, record a demodulated soft value of a received data block on which decoding fails, and a reference sequence number corresponding to the demodulated soft value. For a service that does not support a MAC-layer HARQ, an obtained demodulated soft value of each data block does not additionally carry an RLC PDU sequence number. Therefore, a reference sequence number extracted from a result of failed decoding may be used as a reference sequence number corresponding to a demodulated soft value of the failed decoding.

For a service that does not support a MAC-layer HARQ and uses an RLC AM entity, if decoding of a data block of the service fails, an RLC layer performs at least one retransmission until decoding succeeds or a retransmission threshold is reached. Therefore, the historical demodulated soft value record table may record demodulated soft values of decoding when the data block is transmitted multiple times and a reference sequence number of each decoding.

Reference sequence numbers obtained from results of the failed decoding may not be able to accurately reflect a sequence number of the data block. Therefore, the matching historical demodulated soft value may be obtained by performing matching on lowest bits of the reference sequence numbers. Reference sequence numbers with same lowest bits may be considered as different decoding values of a same data block after the data block is retransmitted.

Specifically, at least one first historical demodulated soft value record may be determined in the historical demodulated soft value records according to the reference sequence number of the data block, and a demodulated soft value of each first historical demodulated soft value record is obtained as a matching historical demodulated soft value.

The $0^{th}$ bit to the $M^{th}$ bit in binary of a reference sequence number of each first historical demodulated soft value record are the same as the $0^{th}$ bit to the $M^{th}$ bit in binary of the reference sequence number of the data block. In other words, a historical demodulated soft value record of which the lowest (M+1) bits of a sequence number are the same as the lowest (M+1) bits of the reference sequence number of the data block is determined as the first historical demodulated soft value record. M is a positive integer greater than 0 and less than or equal to N, N is a binary length of the reference sequence number of the data block, and usually, N is less than or equal to 12. In other words, reference sequence numbers with same lowest (M+1) bits may be considered as different decoding values of an RLC PDU sequence number of a same data block in different transmissions, and therefore, corresponding demodulated soft values may be considered as demodulated soft values of a same data block in different transmissions.

Step 404: Combine the demodulated soft value of the data block and the at least one matching historical demodulated soft value obtained in step 403 to obtain a combined demodulated soft value of the data block.

The demodulated soft value of the data block and the at least one matching historical demodulated soft value may be combined in various manners. For example, the demodulated soft value of the data block and the obtained at least one matching historical demodulated soft value are added up to obtain a combined demodulated soft value of the data block. For another example, according to a quality threshold, a historical demodulated soft value satisfying a quality threshold requirement is selected from the one or more obtained matching historical demodulated soft values, and the selected historical demodulated soft value and the demodulated soft value of the data block are added up to obtain a combined demodulated soft value of the data block. It should be noted that the above are merely examples, and the present invention is not limited thereto.

Step 405: Perform second channel decoding on the combined demodulated soft value of the data block obtained in step 404.

The second channel decoding may be deployed at a physical layer and use VA decoding or high-order decoding, or may be deployed at an RLC layer and use VA decoding or high-order decoding. Using an uplink direction of a UMTS system as an example, when the second channel decoding is deployed at a physical layer and uses VA or high-order decoding, the channel decoding apparatus in this embodiment of the present invention may be deployed on a NodeB; when the second channel decoding is deployed at an RLC layer and uses VA or high-order decoding, the channel decoding apparatus in this embodiment of the present invention may be deployed on an RNC. Using a downlink direction of a UMTS system as an example, the channel decoding apparatus in this embodiment of the present invention may be deployed on a mobile terminal, and a second channel decoding apparatus may be deployed at a physical layer and use VA or high-order decoding, or may be deployed at an RLC layer and use VA or high-order decoding. It should be noted that described here are merely examples, and this embodiment of the present invention is not limited thereto.

In another embodiment of the present invention, if the decoding in step 405 fails, step 406 may further be included.

Step 406: Add a second historical demodulated soft value record to the historical demodulated soft value record table, where a reference sequence number of the second historical demodulated soft value record is the reference sequence number of the data block, and a demodulated soft value of the second historical demodulated soft value record is a demodulated soft value of the data block. In other words, a soft value adding unit may add the demodulated soft value and the reference sequence number of the data block as one historical demodulated soft value record to the historical demodulated soft value record table, for use in combination and decoding when the data block is retransmitted and decoded next time.

In another embodiment of the present invention, if the decoding in step 405 succeeds, step 407 may further be included.

Step 407: Delete the first historical demodulated soft value record that corresponds to the combined historical demodulated soft value and that is determined in step 403. Because the decoding of the data block succeeds, the historical demodulated soft value record matching the data block may be deleted so as to save storage space.

In another embodiment of the present invention, based on steps 401 to 405, optional step 408 may further be included.

Step 408: If a storage time of a third historical demodulated soft value record exceeds a time threshold T, delete the third historical demodulated soft value record so as to save storage space.

Functions of the steps of the method in this embodiment of the present invention can be correspondingly implemented by the components of the foregoing apparatus embodiments and are described in the foregoing apparatus embodiments, and details are not described herein again.

By means of the method in this embodiment of the present invention, for a service that does not support a MAC-layer HARQ and is in RLC AM, when transmission of a data block occurs, if decoding fails, decoding is performed one more time after demodulated soft values, received one or more times, of the data block are combined. This can increase a decoding success rate, thereby reducing a quantity of retransmissions of the data block and improving quality of service.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces, indirect couplings or communication connections between the apparatuses or units, or electrical connections, mechanical connections, or connections in other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

With descriptions of the foregoing implementations, a person skilled in the art may clearly understand that the present invention may be implemented by hardware, firmware or a combination thereof. When the present invention is implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a computer. The following provides an example but does not impose a limitation: The computer-readable medium may include a RAM, a ROM, an EEPROM, a CD-ROM, or another optical disc storage or disk storage medium, or another magnetic storage device, or any other medium that can carry or store expected program code in a form of an instruction or a data structure and can be accessed by a computer. In addition, any connection may be appropriately defined as a computer-readable medium. For example, if software is transmitted from a website, a server or another remote source by using a coaxial cable, an optical fiber/cable, a twisted pair, a digital subscriber line (DSL) or wireless technologies such as infrared ray, radio and microwave, the coaxial cable, optical fiber/cable, twisted pair, DSL or wireless technologies such as infrared ray, radio and microwave are included in definition of a medium to which they belong. For example, a disk (Disk) and disc (disc) used by the present invention includes a compact disc (CD), a laser disc, an optical disc, a digital versatile disc (DVD), a floppy disk and a Blu-ray disc, where the disk generally copies data by a magnetic means, and the disc copies data optically by a laser means. The foregoing combination should also be included in the protection scope of the computer-readable medium.

In conclusion, the foregoing descriptions are merely examples of embodiments of the technical solutions of the present invention, but are not intended to limit the protection scope of the present invention. Any modification, equivalent replacement, or improvement made without departing from the spirit and principle of the present invention shall fall within the protection scope of the present invention.

What is claimed is:

1. A channel decoding apparatus, comprising:
   a memory storing instructions; and
   a processor coupled to the memory to execute the instructions to:
     obtain decoding information of first channel decoding of a data block, wherein the decoding information of the first channel decoding comprises a decoding result of the first channel decoding of the data block and a demodulated soft value of the data block;

determine whether the first channel decoding fails based on a check on the decoding result of the first channel decoding of the data block;

in response to determining that the first channel decoding fails, obtain a reference sequence number of the data block according to the decoding result of the first channel decoding of the data block;

obtain at least one matching historical demodulated soft value from a historical demodulated soft value record table according to the reference sequence number of the data block, wherein the historical demodulated soft value record table comprises at least one historical demodulated soft value record, and each of the at least one historical demodulated soft value record comprises a historical demodulated soft value and a reference sequence number of a data block corresponding to the historical demodulated soft value;

combine the demodulated soft value of the data block and the at least one matching historical demodulated soft value to obtain a combined demodulated soft value of the data block; and perform second channel decoding on the combined demodulated soft value of the data block.

2. The apparatus according to claim 1, wherein the first channel decoding comprises at least one of:
Viterbi algorithm (VA) decoding at physical-layer or high-order decoding at the physical-layer; or
VA decoding at radio link control (RLC)-layer or high-order decoding at the RLC-layer, wherein
the high-order decoding at the physical-layer or the RLC-layer comprises parallel list VA decoding or serial list VA decoding at the respective layer.

3. The channel decoding apparatus according to claim 1, wherein the processor executes the instructions to:
determine at least one first historical demodulated soft value record in the historical demodulated soft value record table according to the reference sequence number of the data block, wherein a $0^{th}$ bit to an $M^{th}$ bit in binary of a reference sequence number of the at least one first historical demodulated soft value record are the same as a $0^{th}$ bit to a $M^{th}$ bit in binary of the reference sequence number of the data block, wherein M is a positive integer greater than 0 and less than or equal to N, and N is a binary length of the reference sequence number of the data block; and
obtain, from the at least one first historical demodulated soft value record, a demodulated soft value of the record as the at least one matching historical demodulated soft value.

4. The channel decoding apparatus according to claim 1, wherein the processor executes the instructions to:
add up the demodulated soft value of the data block and the at least one matching historical demodulated soft value to obtain the combined demodulated soft value of the data block; or
combine the demodulated soft value of the data block and the at least one matching historical demodulated soft value according to a quality threshold, to obtain the combined demodulated soft value of the data block.

5. The channel decoding apparatus according to claim 1, wherein the second channel decoding comprises at least one of:
Viterbi algorithm (VA) decoding at physical-layer or high-order decoding at the physical-layer; or
VA decoding at radio link control (RLC)-layer or high-order decoding at the RLC-layer, wherein the high-order decoding at the physical-layer or the RLC-layer comprises parallel list VA decoding or serial list VA decoding at the respective layer.

6. The channel decoding apparatus according to claim 1, wherein the processor further executes the instructions to:
in response to determining that the second channel decoding fails, add a second historical demodulated soft value record to the historical demodulated soft value record table, wherein a reference sequence number of the second historical demodulated soft value record is the reference sequence number of the data block, and a demodulated soft value of the second historical demodulated soft value record is a demodulated soft value of the data block.

7. The channel decoding apparatus according to claim 1, wherein the processor further executes the instructions to:
in response to determining that the second channel decoding succeeds, delete the at least one first historical demodulated soft value record from the historical demodulated soft value record table.

8. The channel decoding apparatus according to claim 1, wherein a service type of the data block is signaling or an R99 packet service.

9. The channel decoding apparatus according to claim 1, wherein the channel decoding apparatus is deployed on a base station, a controller, or a mobile terminal.

10. A channel decoding method, wherein the method comprises:
obtaining decoding information of first channel decoding of a data block, wherein the decoding information of the first channel decoding comprises a decoding result of the first channel decoding of the data block and a demodulated soft value of the data block;
determining whether the first channel decoding fails based on a check on the decoding result of the first channel decoding of the data block;
in response to determining that the first channel decoding fails, obtaining a reference sequence number of the data block according to the decoding result of the first channel decoding of the data block;
obtaining at least one matching historical demodulated soft value from a historical demodulated soft value record table according to the reference sequence number of the data block, wherein the historical demodulated soft value record table comprises at least one historical demodulated soft value record, and each of the at least one historical demodulated soft value record comprises a historical demodulated soft value and a reference sequence number of a data block corresponding to the historical demodulated soft value;
combining the demodulated soft value of the data block and the at least one matching historical demodulated soft value to obtain a combined demodulated soft value of the data block; and
performing second channel decoding on the combined demodulated soft value of the data block.

11. The method according to claim 10, wherein the first channel decoding comprises at least one of:
Viterbi algorithm (VA) decoding at physical-layer or high-order decoding at the physical-layer; or
VA decoding at radio link control (RLC)-layer or high-order decoding at the RLC-layer, wherein
the high-order decoding at the physical-layer or the RLC-layer comprises parallel list VA decoding or serial list VA decoding at the respective layer.

12. The method according to claim 10, wherein the obtaining at least one matching historical demodulated soft value from a historical demodulated soft value record table according to the reference sequence number of the data block comprises:
  determining at least one first historical demodulated soft value record in the historical demodulated soft value record table according to the reference sequence number of the data block, wherein a $0^{th}$ bit to an $M^{th}$ bit in binary of a reference sequence number of the at least one first historical demodulated soft value record are the same as a $0^{th}$ bit to an $M^{th}$ bit in binary of the reference sequence number of the data block, wherein M is a positive integer greater than 0 and less than or equal to N, and N is a binary length of the reference sequence number of the data block; and
  obtaining, from the at least one first historical demodulated soft value record, a demodulated soft value of the record as the at least one matching historical demodulated soft value.

13. The method according to claim 10, wherein the combining the demodulated soft value of the data block and the at least one matching historical demodulated soft value to obtain a combined demodulated soft value of the data block comprises:
  adding up the demodulated soft value of the data block and the at least one matching historical demodulated soft value to obtain the combined demodulated soft value of the data block; or
  combining the demodulated soft value of the data block and the at least one matching historical demodulated soft value according to a quality threshold, to obtain the combined demodulated soft value of the data block.

14. The method according to claim 10, wherein the second channel decoding comprises at least one of:
  Viterbi algorithm (VA) decoding at physical-layer or high-order decoding at the physical-layer; or
  VA decoding at radio link control (RLC)-layer or high-order decoding at the RLC-layer, wherein
  the high-order decoding at the physical-layer or the RLC-layer comprises parallel list VA decoding or serial list VA decoding at the respective layer.

15. The method according to claim 10, wherein the method further comprises:
  in response to determining that the second channel decoding fails, adding a second historical demodulated soft value record to the historical demodulated soft value record table, wherein a reference sequence number of the second historical demodulated soft value record is the reference sequence number of the data block, and a demodulated soft value of the second historical demodulated soft value record is a demodulated soft value of the data block.

16. The method according to claim 10, wherein the method further comprises:
  in response to determining that the second channel decoding succeeds, deleting the at least one first historical demodulated soft value record from the historical demodulated soft value record table.

17. The method according to claim 10, wherein a service type of the data block is signaling or an R99 packet service.

18. A channel decoding system, wherein the system comprises:
  a demodulator, configured to demodulate a received data block to obtain a demodulated soft value of the data block;
  a first channel decoding apparatus, comprising:
    a memory storing instructions; and
    a processor coupled to the memory to execute the instructions to perform first channel decoding of the data block by decoding the demodulated soft value of the data block obtained by the demodulator; and
  a second channel decoding apparatus comprising:
    a memory storing instructions; and
    a processor coupled to the memory to execute the instructions to:
      obtain decoding information of the first channel decoding of the data block, wherein the decoding information of the first channel decoding comprises a decoding result of the first channel decoding of the data block and a demodulated soft value of the data block;
      determine whether the first channel decoding fails based on a check on the decoding result of the first channel decoding of the data block;
      in response to determining that the first channel decoding fails, obtain a reference sequence number of the data block according to the decoding result of the first channel decoding of the data block;
      obtain at least one matching historical demodulated soft value from a historical demodulated soft value record table according to the reference sequence number of the data block, wherein the historical demodulated soft value record table comprises at least one historical demodulated soft value record, and each of the at least one historical demodulated soft value record comprises a historical demodulated soft value and a reference sequence number of a data block corresponding to the historical demodulated soft value;
      combine the demodulated soft value of the data block and the at least one matching historical demodulated soft value to obtain a combined demodulated soft value of the data block; and
      perform second channel decoding on the combined demodulated soft value of the data block.

* * * * *